(12) United States Patent
Sciriha et al.

(10) Patent No.: US 11,081,541 B2
(45) Date of Patent: Aug. 3, 2021

(54) METHOD OF PROVIDING PARTIAL ELECTRICAL SHIELDING

(71) Applicant: Intel Corporation, Santa Clara, CA (US)

(72) Inventors: Veronica Sciriha, Munich (DE); Georg Seidemann, Landshut (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/881,954

(22) Filed: May 22, 2020

(65) Prior Publication Data

US 2020/0286982 A1 Sep. 10, 2020

Related U.S. Application Data

(62) Division of application No. 16/020,772, filed on Jun. 27, 2018, now Pat. No. 10,700,159.

(51) Int. Cl.
*H01L 23/64* (2006.01)
*H01L 49/02* (2006.01)
(Continued)

(52) U.S. Cl.
CPC .......... *H01L 28/10* (2013.01); *H01L 23/5227* (2013.01); *H01L 23/645* (2013.01);
(Continued)

(58) Field of Classification Search
CPC ................... H01L 23/645; H01L 28/10; H01L 2924/19042; H01L 23/5227; H01L 23/552;
(Continued)

(56) References Cited

U.S. PATENT DOCUMENTS

2004/0245580 A1* 12/2004 Lin ..................... H01L 21/82
257/379
2008/0042236 A1* 2/2008 Seah Teo Leng .... H01L 29/402
257/531
(Continued)

OTHER PUBLICATIONS

"U.S. Appl. No. 16/020,772, Non Final Office Action dated Nov. 1, 2019", 8 pgs.
(Continued)

*Primary Examiner* — Eric A. Ward
(74) *Attorney, Agent, or Firm* — Schwegman Lundberg & Woessner, P.A.

(57) ABSTRACT

A system and method of providing a coil in an electronic communication device in is disclosed. Multiple dielectric layers are deposited and patterned on a semiconductor substrate or insulating mold compound. The dielectric layers provide conductive contact with a contact pad on the underlying structure. Shielding for the coil, including a seed layer covered by an insulating material, is disposed in a via of a lowermost of the dielectric layers. Grounding of the shielding seed layer is through a contact pad on the substrate or a trace between the dielectric layers. A coil is fabricated over the shielding and a solder mask deposited and patterned to cover and insulate the coil. The coil is fabricated in a via of a dielectric layer immediately below the solder mask or above this dielectric layer. Electrical contact is provided by multiple copper and seed layers in the solder mask and dielectric layers.

22 Claims, 16 Drawing Sheets

(51) Int. Cl.
*H01L 23/522* (2006.01)
*H01L 23/00* (2006.01)

(52) U.S. Cl.
CPC ...... *H01L 24/05* (2013.01); *H01L 2224/0346* (2013.01); *H01L 2224/0401* (2013.01); *H01L 2224/05008* (2013.01); *H01L 2224/05147* (2013.01); *H01L 2924/19042* (2013.01); *H01L 2924/19104* (2013.01); *H01L 2924/3025* (2013.01)

(58) Field of Classification Search
CPC . H01L 24/03; H01L 24/05; H01L 2224/0346; H01L 2224/0401; H01L 2224/05008; H01L 29/0649; H01L 29/0653
See application file for complete search history.

(56) References Cited

U.S. PATENT DOCUMENTS

| | | | |
|---|---|---|---|
| 2013/0292793 A1* | 11/2013 | Poucher | H01L 23/562 257/522 |
| 2014/0312458 A1* | 10/2014 | Ashrafzadeh | H01L 25/0652 257/531 |
| 2016/0372483 A1 | 12/2016 | Cho | |
| 2017/0077079 A1* | 3/2017 | Lan | H01L 28/75 |
| 2017/0125317 A1* | 5/2017 | Kuo | H01L 23/49811 |
| 2018/0097055 A1 | 4/2018 | Pizzi et al. | |
| 2019/0103370 A1* | 4/2019 | Huang | H01L 21/4857 |
| 2020/0006244 A1 | 1/2020 | Sciriha et al. | |

OTHER PUBLICATIONS

"U.S. Appl. No. 16/020,772, Notice of Allowance dated Feb. 21, 2020", 8 pgs.

"U.S. Appl. No. 16/020,772, Response filed Feb. 3, 2020 to Non Final Office Action dated Nov. 1, 2019", 10 pgs.

"U.S. Appl. No. 16/020,772, Response filed Jul. 24, 2019 to Restriction Requirement dated May 24, 2019", 8 pgs.

"U.S. Appl. No. 16/020,772, Restriction Requirement dated May 24, 2019", 6 pgs.

* cited by examiner

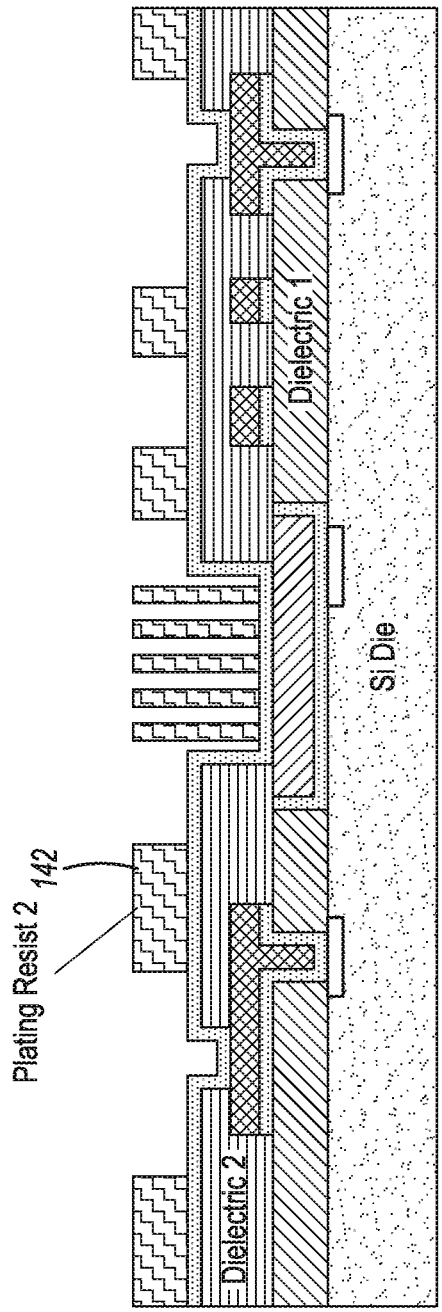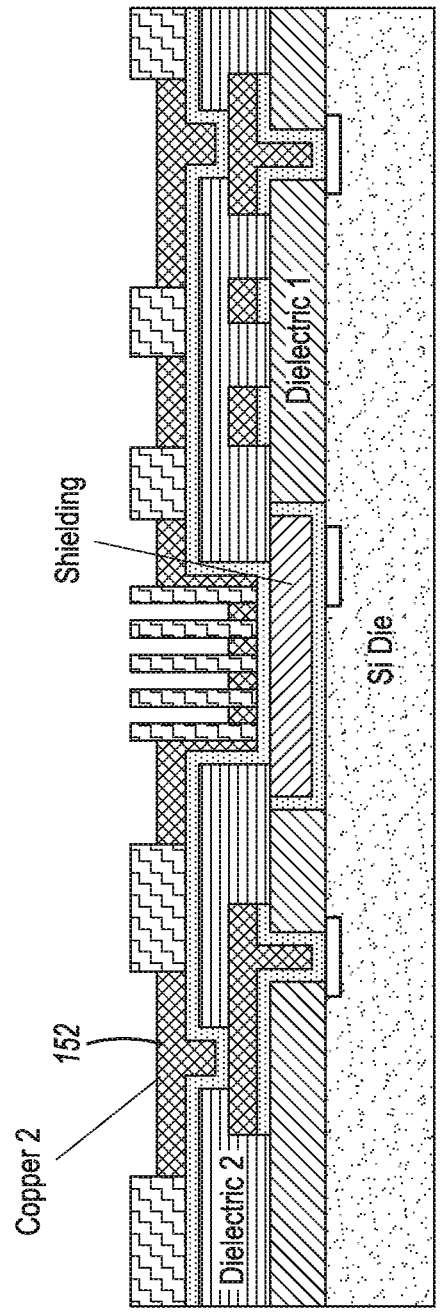

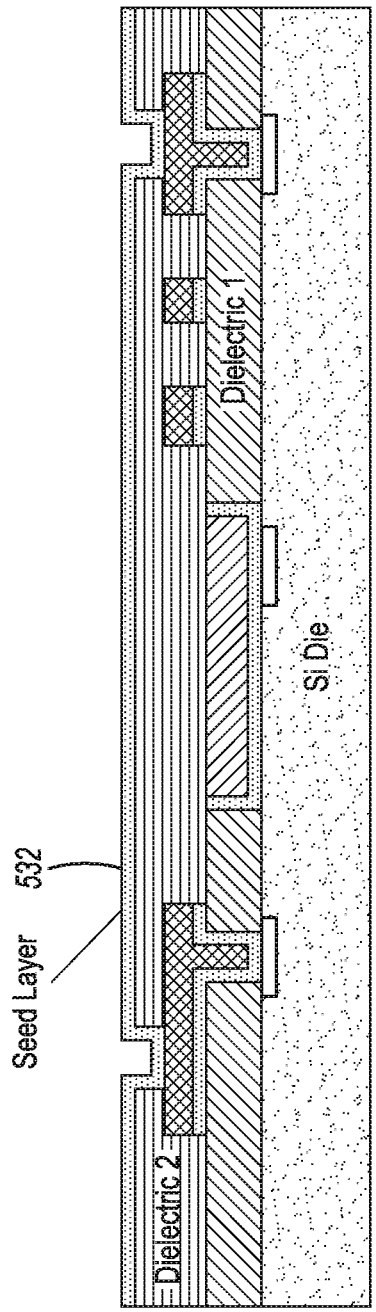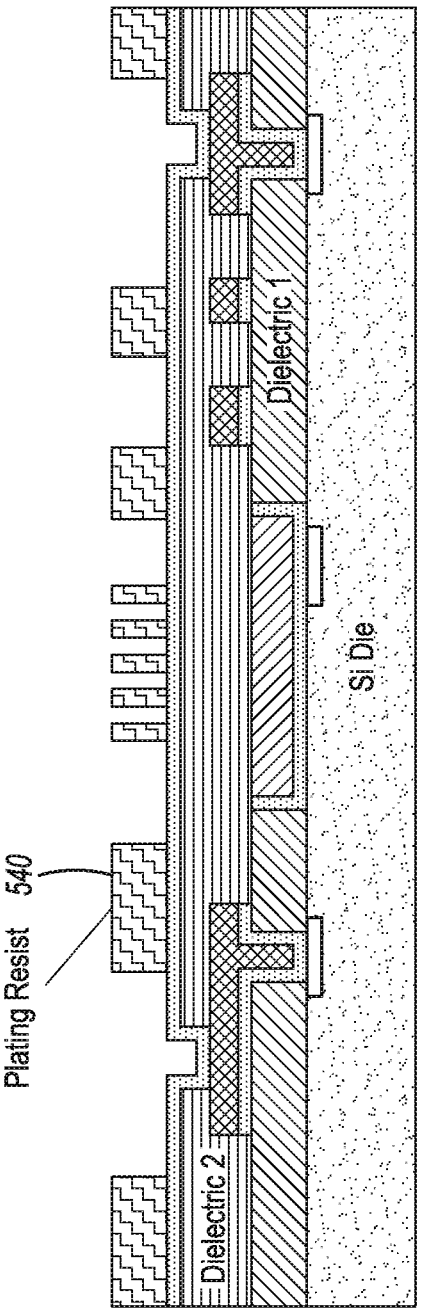

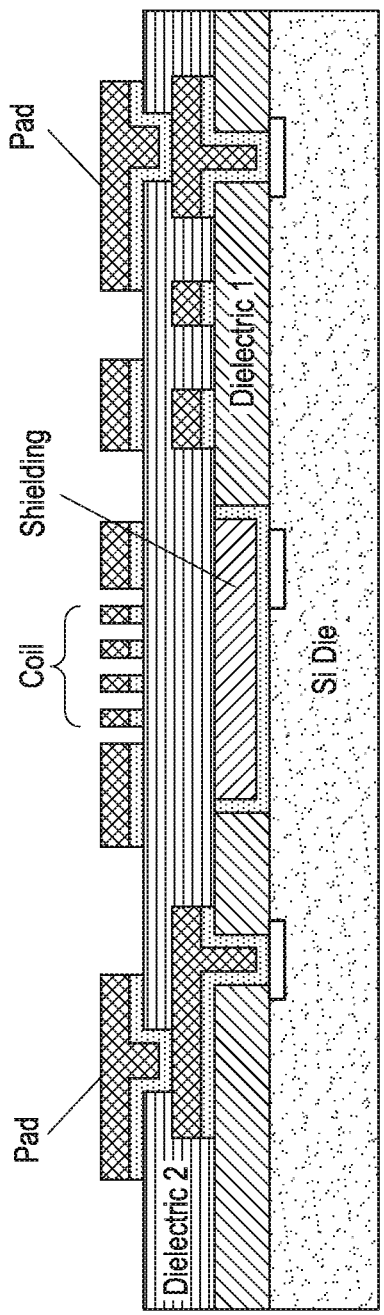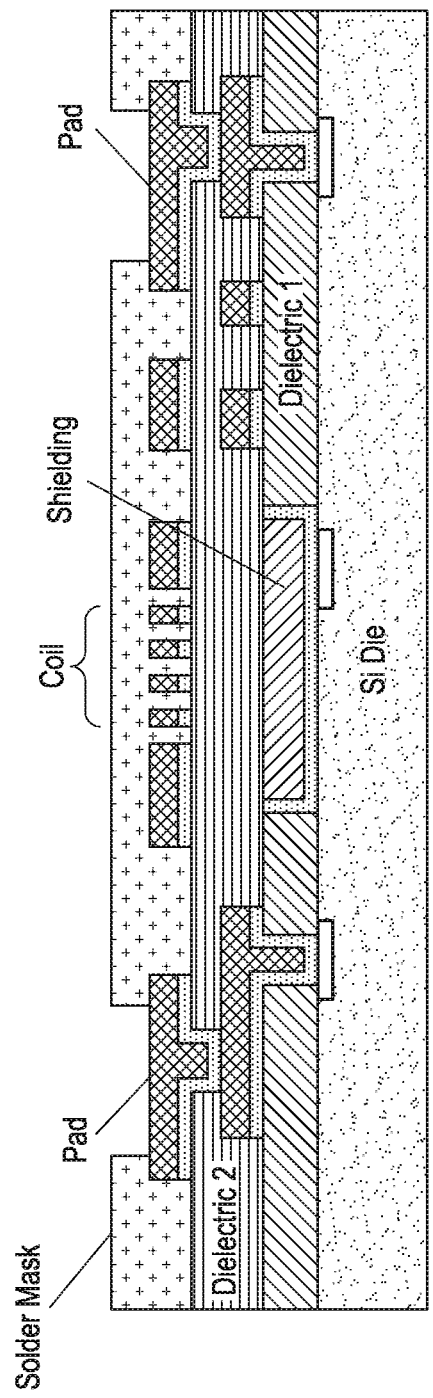

METHOD OF PROVIDING PARTIAL ELECTRICAL SHIELDING

This application is a divisional of U.S. patent application Ser. No. 16/020,772, filed Jun. 27, 2018, which is incorporated herein by reference in its entirety.

TECHNICAL FIELD

This disclosure relates generally to electromagnetic interference (EMI) shielding in electronic devices. Some embodiments are related to a manufacturing process to provide EMI shielding for an electronics package. Some embodiments are related to EMI shielded packages produced using one of the manufacturing processes.

BACKGROUND

Electronic devices continue to permeate every aspect of daily life. Among the many types of electronic devices, smartphones and other electronic communication devices that rely on microelectronics have exploded in popularity over the last several decades. Electronic communication devices have progressed from analog to digital devices and in current incarnations typically communicate using multiple radio frequency (RF) bands. Such devices may employ several coils, for example, for communication in the different RF bands and for diplex communications, as well as for wireless charging, which is also increasing in popularity. However, the addition of multiple coils, which are typically much larger than the underlying electronics, may result in extensive EMI or crosstalk. Countering such crosstalk is becoming more and more challenging due to the increasing operating frequencies, which may soon extend to the tens of gigahertz. Shielding the coils in an electronics package to prevent the crosstalk, however, may be significantly improved.

BRIEF DESCRIPTION OF THE DRAWINGS

FIGS. 5A-5I illustrate cross-sections of a device with shielding in accordance with some embodiments.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As above, improved shielding may be desirable for coils in a communication electronics package. In some cases, coils may be placed in the Si-Die. Adequate shielding or isolation may be provided on the die in the lateral directions between the coil and adjacent signal lines. Such shielding may be also desirable in the z-direction between the coil and the underlying package. However, providing shielding in the die when the coil is on the die may be challenging due to the limited available area on the die. In addition, in some circumstances, partial shielding of the coils may be desirable to enable additional coil connections to be maintained. To this end, in some embodiments, the coil may be disposed in the package. Fabricating the coil within the package may increase the amount of area available for shielding and enable sufficient isolation of the coils, thereby reducing the amount of crosstalk and other interference.

Some embodiments herein may provide multiple vias in a first dielectric layer. The vias may have different planar dimensions and the same height (z direction). The larger of the vias may be used for the realization of a coil, including a shielding. A seed layer may be sputtered in the big via and covered by plating resist. The covered seed layer in the big via may remain after etching the seed layer. This may permit a smaller area to be used for shielding the coil in the big via, as well as provide for partial shielding in some embodiments.

Figure 1A:
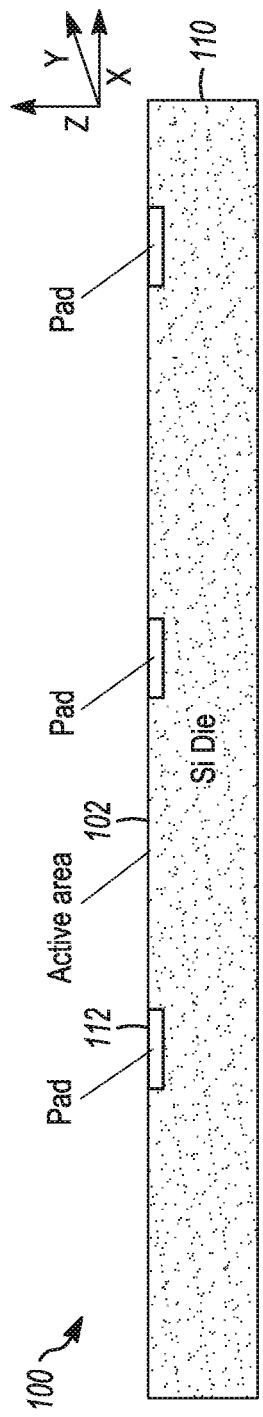
FIGS. 1A-1O illustrate cross-sections of a process for manufacturing a device with shielding in accordance with some embodiments.
Figure 1B:
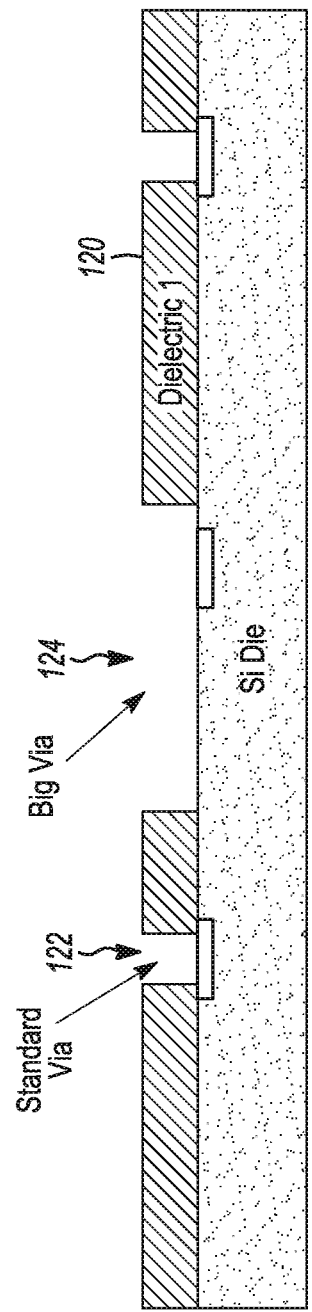
Figure 1C:
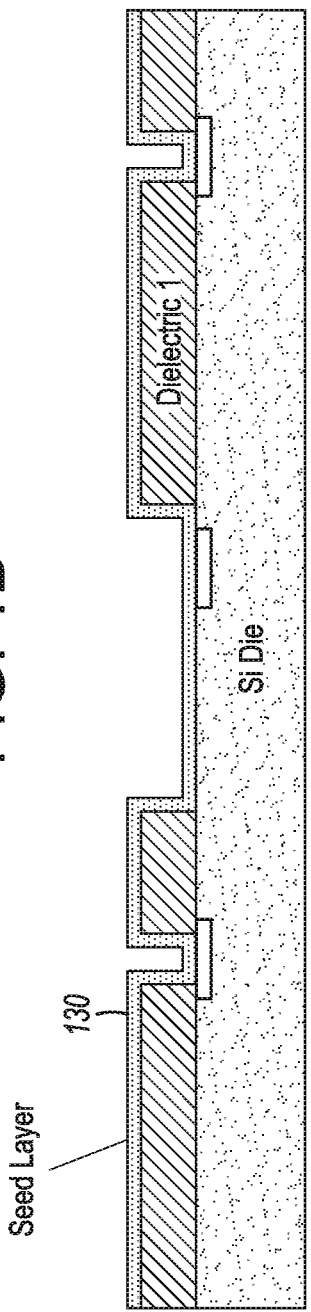
Figure 1D:
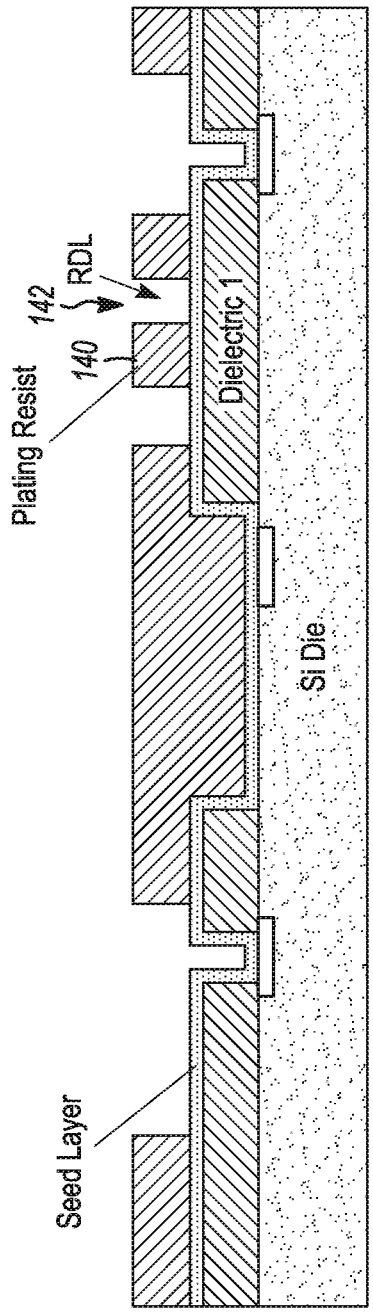
Figure 1E:
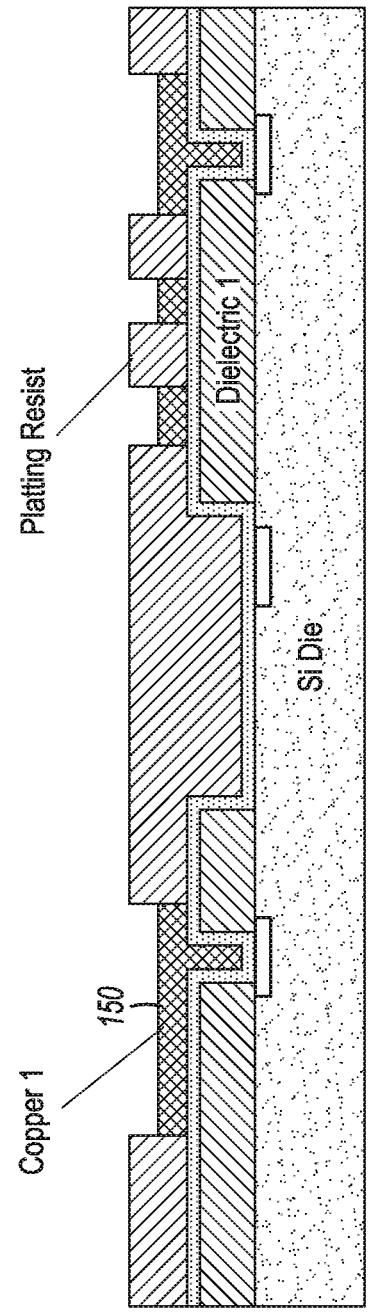
Figure 1F:
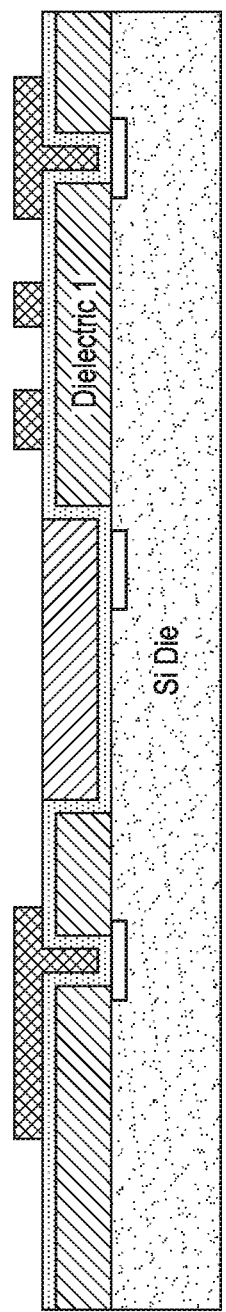
Figure 1G:
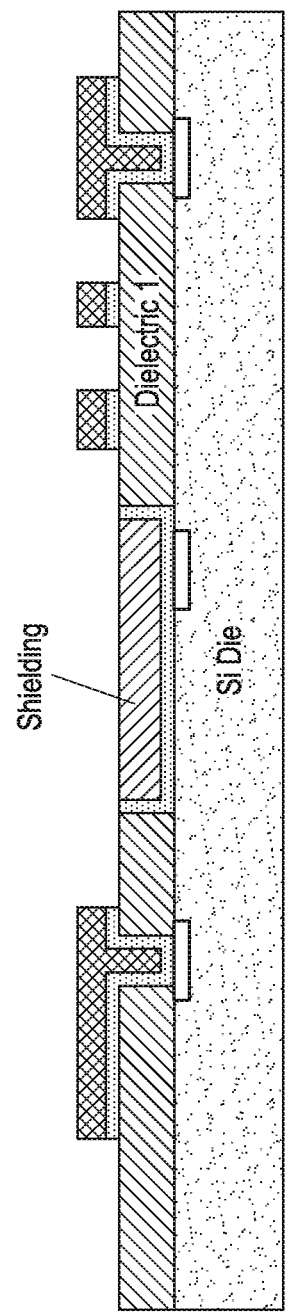
Figure 1H:
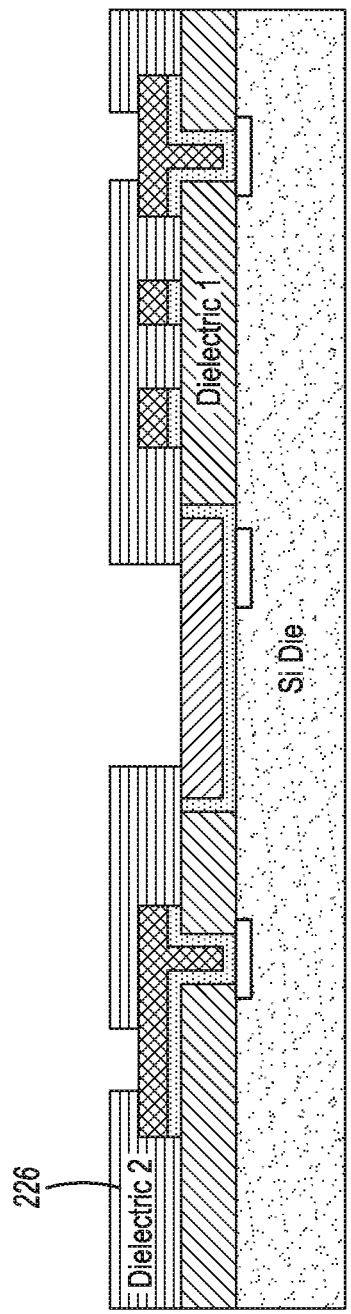
Figure 1I:
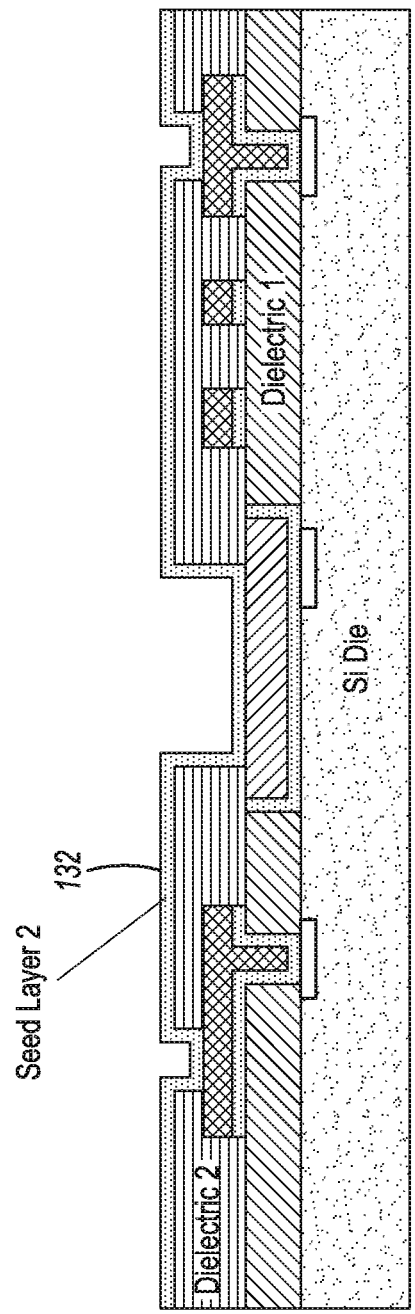
Figure 1L:
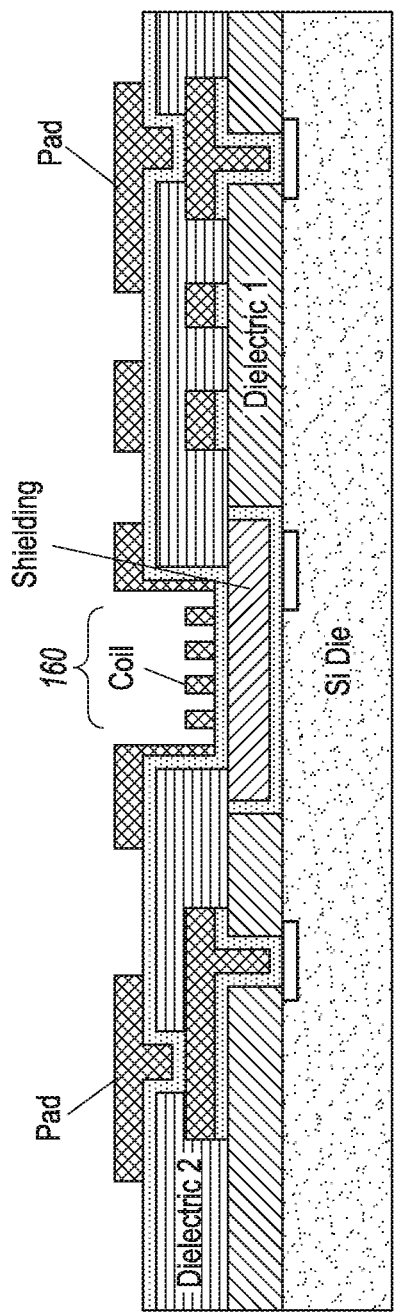
Figure 1M:
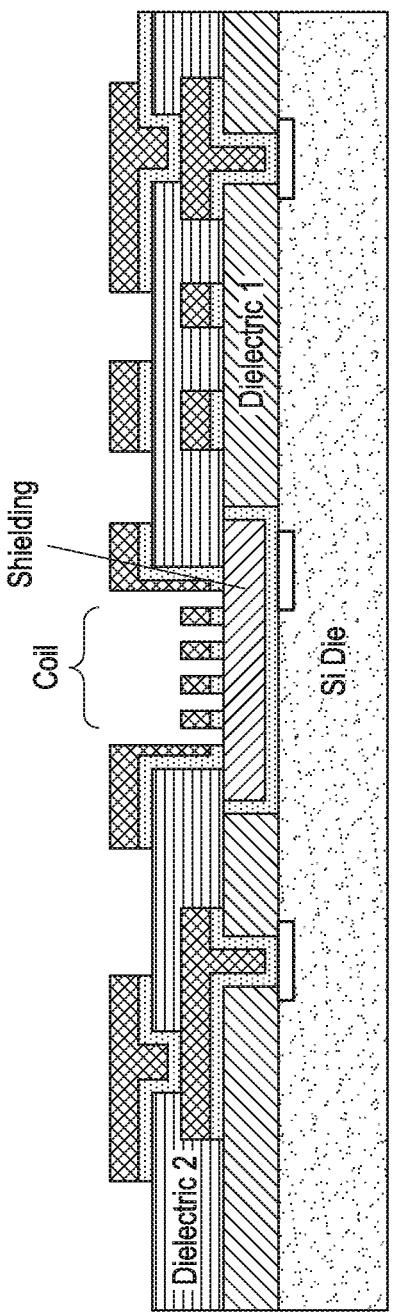
Figure 1N:
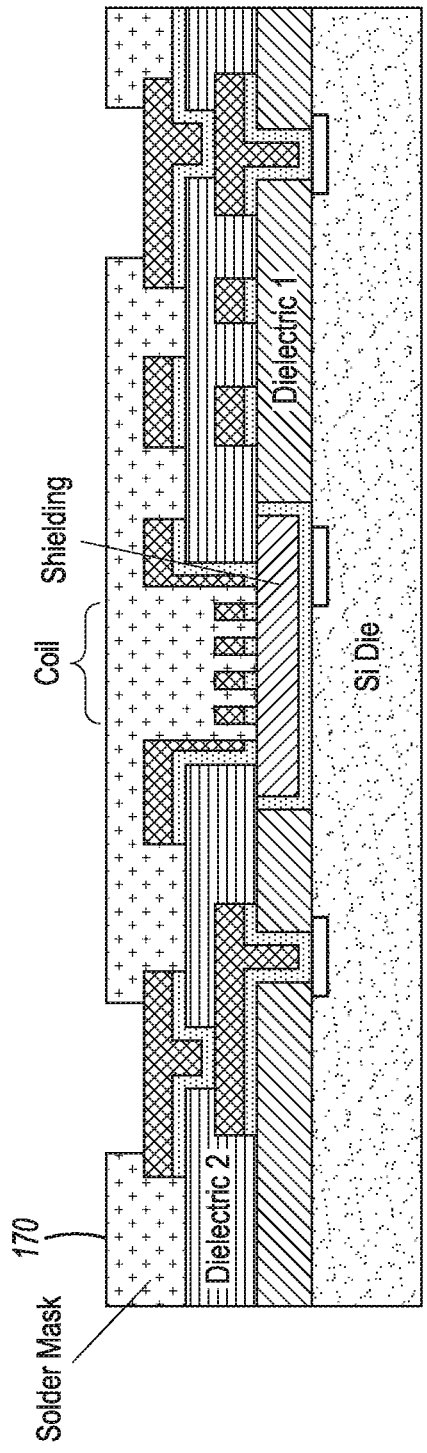
Figure 1O:
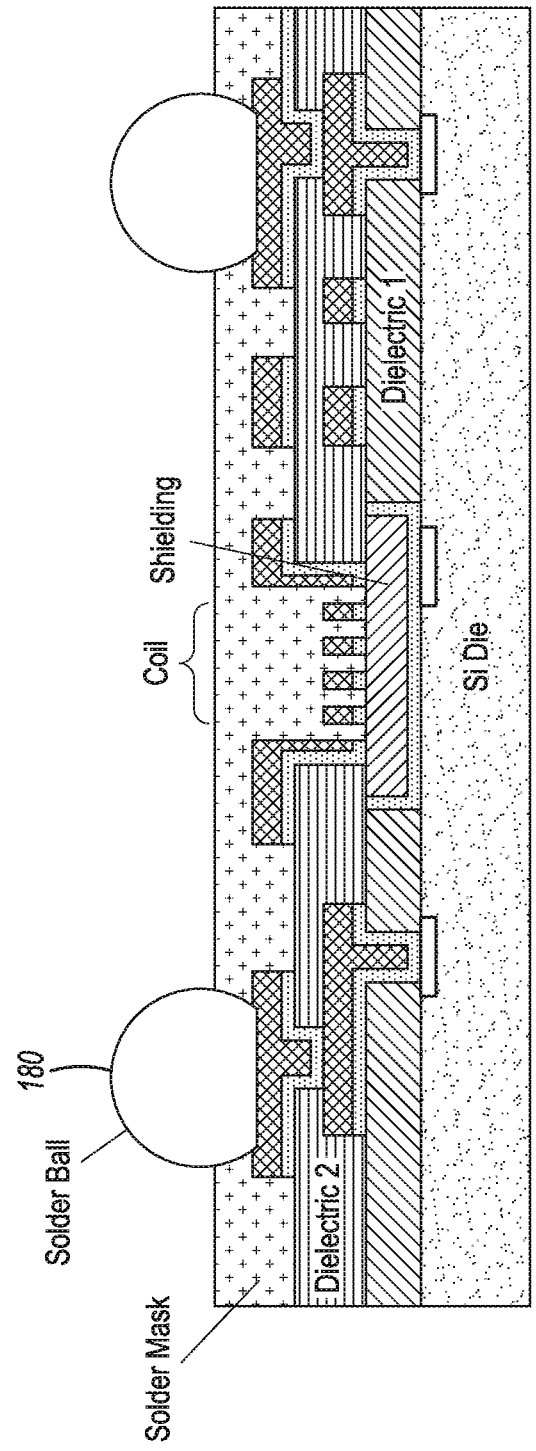

FIGS. 1A-1O illustrate cross-section diagram of a process for manufacturing a device with shielding in accordance with some embodiments. As shown in FIG. 1A, the device 100 may be formed on a substrate, such as a Si die 110. The Si die 110 may be polycrystalline Si or any other suitable Si wafer material. Note that in some cases, the processes described herein may be applicable to materials other than Si-based, such as III-V and II-VI based materials.

One or more contact pads 112 may be disposed in an active area 102 on the Si die 110. The active area 102 may eventually contain various active and/or passive elements such as transistors and filters and metallization for example; for convenience however, these elements are not shown despite the contact pads 112. The contact pads 112 may be formed from copper or another conductive material, such as aluminum or gold or a combination thereof, among others. The contact pads 112 may be deposited and patterned using lithographic and etching processes. A typical width (the x direction shown in FIG. 1A) of the contact pads 112 may be about 65 μm, although this may differ dependent on the implementation. The sizes of the contact pads 112 may be the same or may differ among the contact pads 112. For example, the contact pads 112 in the big via area described below may be larger than those in the standard via area. The contact pads 112 may route signals from the electronic components in the device 100 or contacting the solder ball (shown below) or may provide a source of ground (e.g., for the shielding).

A first dielectric 120 may then be spun on and patterned as shown in FIG. 1B. The patterning may be implemented by a lithographic process, for example exposure to UV radiation to cure the exposed first dielectric 120, and subsequent wet etching process to remove the uncured first dielectric 120. The first dielectric 120 may be formed from lead oxide, polyamide or any other suitable insulating material. The patterned first dielectric 120 may contain both standard vias 122 and big via 124. In some embodiments, the standard vias 122 and/or big via 124 may be about 5, 8 or 10 μm wide, although these widths may differ depending on the application. The standard vias 122 and big via 124 may leave at least a portion of the contact pads 112 exposed. In addition to the entire contact pad 112 being exposed in the big via 124, a portion of the Si die 110 may be exposed. Although a certain number of vias are shown, the device 100 may contain a different number of one or both type of via. The dielectrics (or dielectric layers) described herein may serve to isolate different planes of the device on which conductive traces (e.g., circuit elements) are disposed.

After the standard vias 122 and big via 124 have been formed in the first dielectric 120, a seed layer 130 may be sputtered on the first dielectric 120 and patterned as shown in FIG. 1C. The seed layer 130 may be a material used for contact with an overlying conductive layer (e.g., copper). The seed layer 130 may thus be formed from copper or a titanium and tungsten layer with an overlying copper layer, for example. The seed layer 130 may be about 10-15 μm thick.

After the sputtering on (or deposition) of the seed layer 130, a plating resist 140 may be deposited and patterned on the seed layer 130 as shown in FIG. 1D. The plating resist 140 may be an organic material, such as that above, that is spun on or otherwise deposited. The patterning may be implemented as above by a lithographic process, for example exposure to UV radiation to cure the exposed plating resist 140, and subsequent wet etching process to remove the uncured plating resist 140. After removal of the plating resist 140 portions of the seed layer 130 above and adjacent to the standard vias 122 may be exposed. However, the big via 124 may remain protected by the plating resist 140. In addition, one or more redistribution layer openings (RDLs) 142 may be formed in the plating resist 140 above a portion of the dielectric 120 between the big via 124 and at least one of the standard vias 122. The RDLs 142 may be about 5-20 μm wide.

After patterning the plating resist 140, a first copper layer 150 may be plated as shown in FIG. 1E. The plating technique used may be electroplating or electro-less plating. In some embodiments, the first copper layer 150 may not completely fill the vias in the plating resist 140.

After plating the first copper layer 150, some of the plating resist 140 may be removed as shown in FIG. 1F. The removal may be performed using a wet chemical etch, reactive ion etching (RIE) or any other similar technique. Removal of the plating resist 140 may be time-based, with the time dependent on the material of the plating resist 140. After removal of the plating resist 140, the first copper layer 150 may be exposed, as may be portions of the seed layer 130 and portions of the plating resist 140 in the big via 134.

After removal of the plating resist 140, the exposed seed layer 130 may be removed as shown in FIG. 1G. As above, a wet chemical etch based on the seed layer 130 chemistry may be used to effect the removal. As shown, the seed layer 130 may continue to be present under the first copper layer 150 as well as the plating resist 140 in the big via 134. The plating resist 140 in the big via 134, as well as the seed layer 130, may provide vertical shielding for the contact pad 120 in the big via 134.

After removal of the seed layer 130, the second dielectric layer 126 may be deposited and patterned as shown in FIG. 1H. The second dielectric layer 126 may be spun on and patterned in a manner similar to that described in relation to the first dielectric layer 120. The patterning may be implemented by a lithographic process, for example exposure to UV radiation to cure the exposed second dielectric layer 126, and subsequent wet etching process to remove the uncured second dielectric layer 126. The second dielectric layer 126 may be formed from lead oxide, polyamide or any other suitable insulating material and may be the same as or a different material than that of the first dielectric layer 120. The patterned second dielectric layer 126 may expose the plating resist 140 in the big via 134 as well as the first copper layer 150 over the contact pads 112. The first copper layer 150 that are not over the contact pads 112 may be covered by the second dielectric layer 126.

After patterning of the second dielectric layer 126, a second seed layer 132 may be deposited as shown in FIG. 1I. The second seed layer 132 may be composed of the same material as the first seed layer 130.

After the deposition of the second seed layer 132, a second plating resist 142 may be deposited and patterned on the second seed layer 132 as shown in FIG. 1J. The second plating resist 142 may be similar in material to the plating resist 140 or may be different, depending on the processing demands on the second plating resist 142. The patterning may be implemented as above by a lithographic process, as in the above example, curing exposed portions of the second plating resist 142 and subsequent wet etching process to remove the uncured second plating resist 142.

After patterning, vias may be present in various locations, including over the second seed layer 132 connection to the copper layer 150 and over at least some of the RDLs 142. In addition, the second plating resist 142 may be used in formation of the coil in the big via 124, thus portions of the big via 124 may contain the second plating resist 142 and other portions of the second seed layer 132 in the big via 124 may be exposed.

After patterning the second plating resist 142, a second copper layer 152 may be plated as shown in FIG. 1K. The plating technique used may be electroplating or electro-less plating, the same as or different from the plating technique used for plating of the copper layer 150. In some embodiments, the first copper layer 150 may not completely fill the big via 134.

After plating the second copper layer 152, the second plating resist 142 may be removed as shown in FIG. 1L. The removal of the second plating resist 142 may be performed using a wet chemical etch, similar to removal of the plating resist 140. Unlike the removal of the plating resist 140, the removal of the second plating resist 142 may be complete, thereby exposing the second copper layer 152 and exposed portions of the second seed layer 132. Thus, the coil 160 created in the big via 134 is disposed below the top of the second dielectric 126. In some embodiments, the coil 160 may be localized to the area of the big via 134, while in other embodiments the coil 160 may be connected via conductive traces to an edge of the active area 102. Edges of the coil 160 used to connect to other elements on the Si die 102 may be formed on the second dielectric 126. The coil 160 may be used, for example, as transmission or reception circuitry for communication in at least one band, or for wireless charging and thus may be connected with communication or power circuitry.

After removal of the second plating resist 142, the exposed second seed layer 132 may be removed as shown in FIG. 1M. As above, a wet chemical etch based on the second seed layer 132 chemistry or a reactive ion etching (RIE) may be used to effect the removal. As shown, the second seed layer 132 may continue to be present under the second copper layer 152.

After removal of the second seed layer 132, a solder mask 170 may be spun on and patterned as shown in FIG. 1N. As above, the solder mask 170 may be formed from an organic material and the patterning may be implemented as above by a lithographic process, curing exposed portions of the solder mask 170 and subsequent wet etching process to remove the uncured solder mask 170. The solder mask 170 may expose the portions of the second copper layer 152 in electrical connection with the contact pads 112 of the standard vias 122.

After the solder mask 170 is provided, solderballs 180 may be provided in the openings formed in the solder mask 170 as shown in FIG. 1O. The solderballs 180 may be formed from indium, tin, nickel, silver, copper and/or gold, among others, as well as alloys thereof. The solderballs 180 may be used to connect the device 100 (or package) to other circuitry like a printed circuit board (PCB), e.g., via board assembly.

This may reduce the size of the coil shielding in the device and permit greater component integration within the device. In some cases, costs associated with fabricating and isolating the coil may be reduced, as may overall device processing time. Note that although only one coil is shown in the various figures, a number of coils may be distributed across the active area 102. In some embodiments, the shielding may be a conductive layer that may or may not be grounded. The shielding in some embodiments may use a conductive layer but not include the seed layer.

Figure 2:
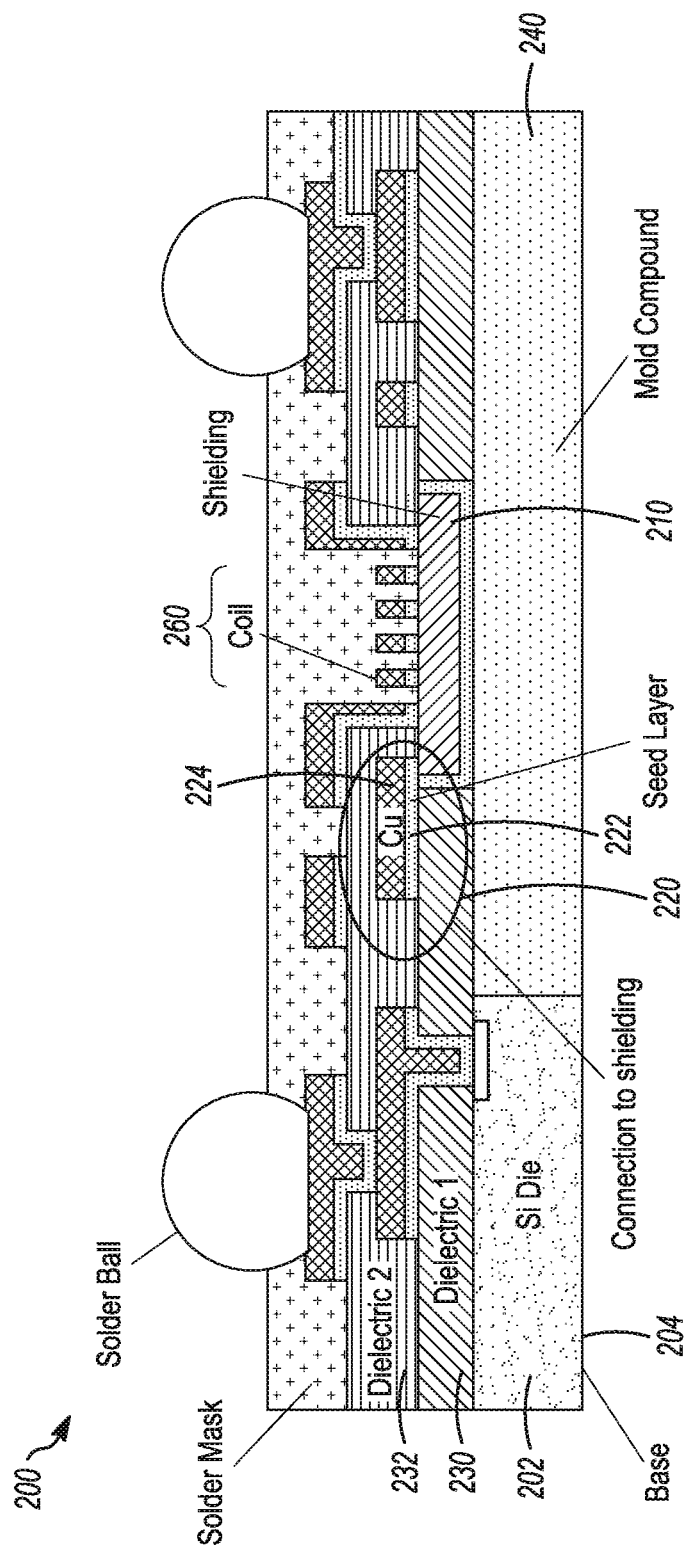
FIG. 2 illustrates a cross-section of a device with shielding in accordance with some embodiments.

FIG. 2 illustrates a cross-section of a device with shielding in accordance with some embodiments. The various layers shown may be composed of the same materials as the layers in FIGS. 1A-1O. The device 200 may use an Embedded Wafer Level Ball Grid Array (eWLB) to allow fanout and more space for interconnect routing on a single Si die 202. One difference may be that while the coil 160 and shielding of FIGS. 1A-1O may be isolated, the shielding 220 (seed layer 222 and copper layer 224) of FIG. 2 may be connected to an edge of the device 200 via an interconnect. The coil 260 may remain buried and be entirely under a top of the second dielectric layer 232. The coil 260 may be formed on a mold compound 240 rather than the Si die 202 as part of the eWLB. The molding compound 240 may be an insulating material, such as one or more epoxy resins. The epoxy resins may be thermoplastic or thermosets, such as cresol novolac or bisphenol. Additionally or alternatively, the molding compound 240 can include inorganic filer, catalyst, flame retardant, stress modifier, and/or an adhesion promoter, among others. The molding compound 240 and Si die 202 may form a base 204 on which the first dielectric 230 and other layers may be formed.

Figure 3:
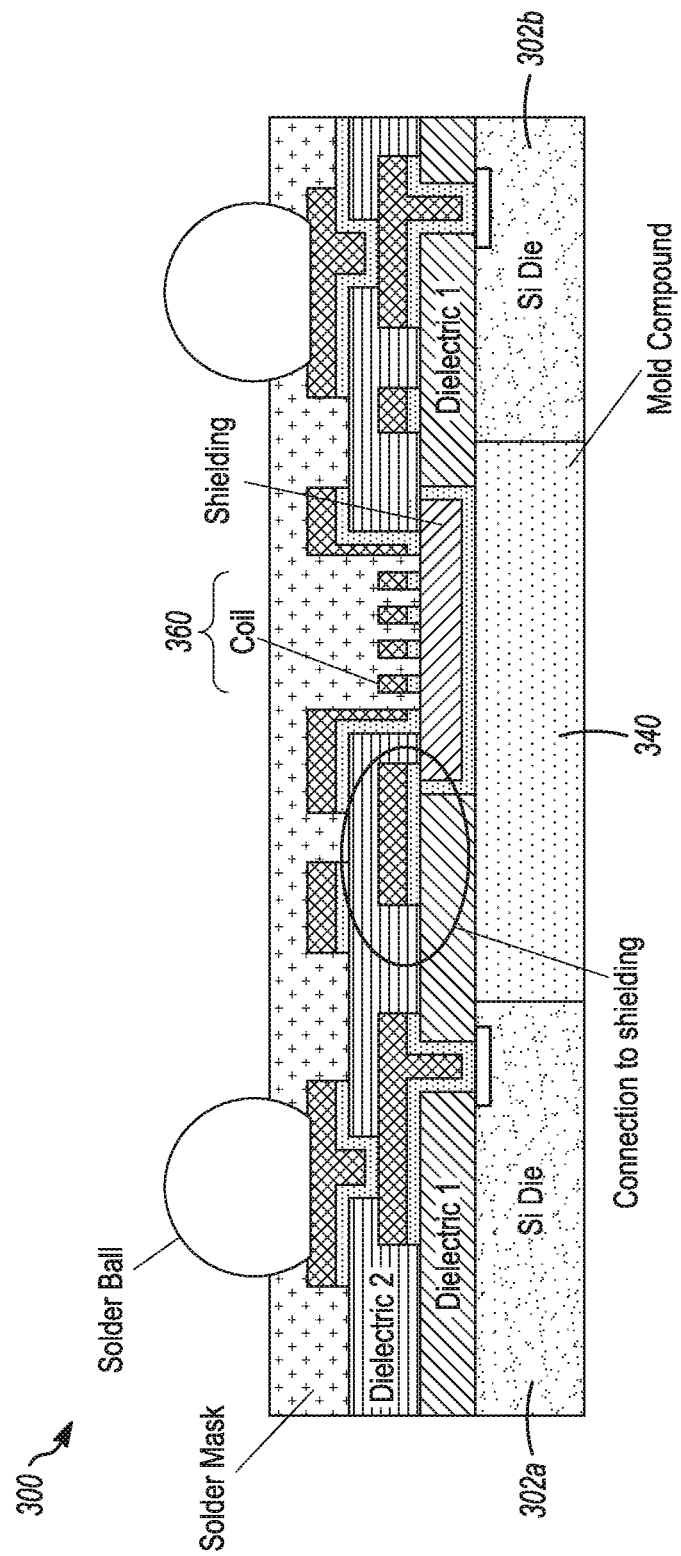
FIG. 3 illustrates a cross-section of a device with shielding in accordance with some embodiments.

FIG. 3 illustrates a cross-section of a device with shielding in accordance with some embodiments. The various layers shown may be composed of the same materials as the layers in FIGS. 1A-1O and FIG. 2. The device 300 may use an eWLB and generally be similar to the device 200 of FIG. 2. However, rather than being on a single Si die, the coil 360 may be on a mold compound 340 and associated with multiple Si dies 302a, 302b.

Figure 4A:
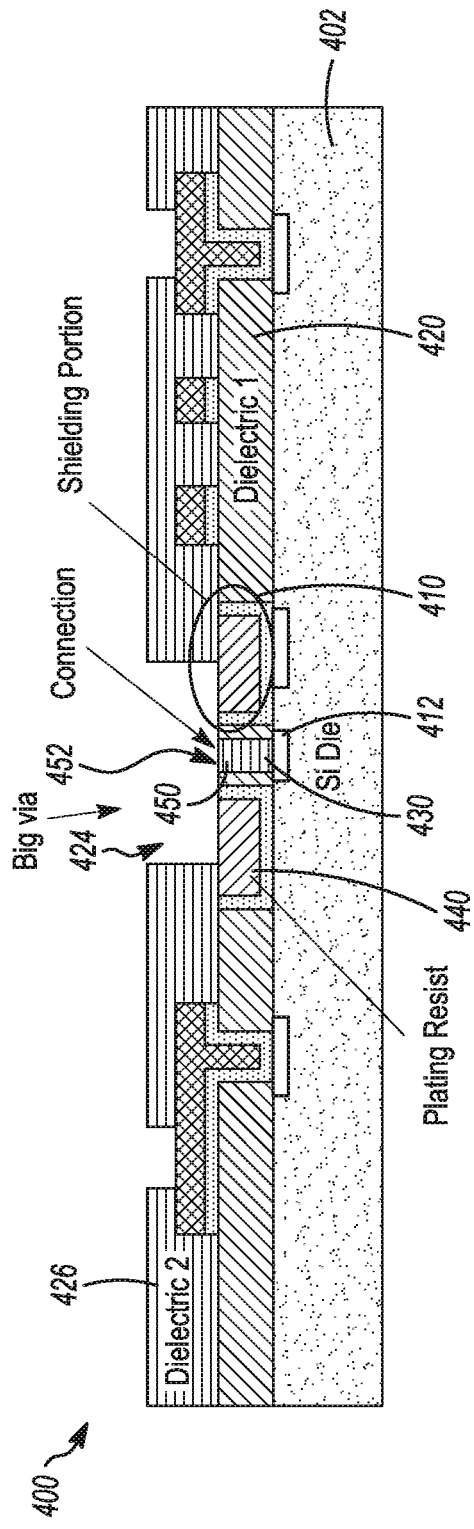
FIGS. 4A-4B illustrate cross-sections of a device with shielding in accordance with some embodiments.
Figure 4B:
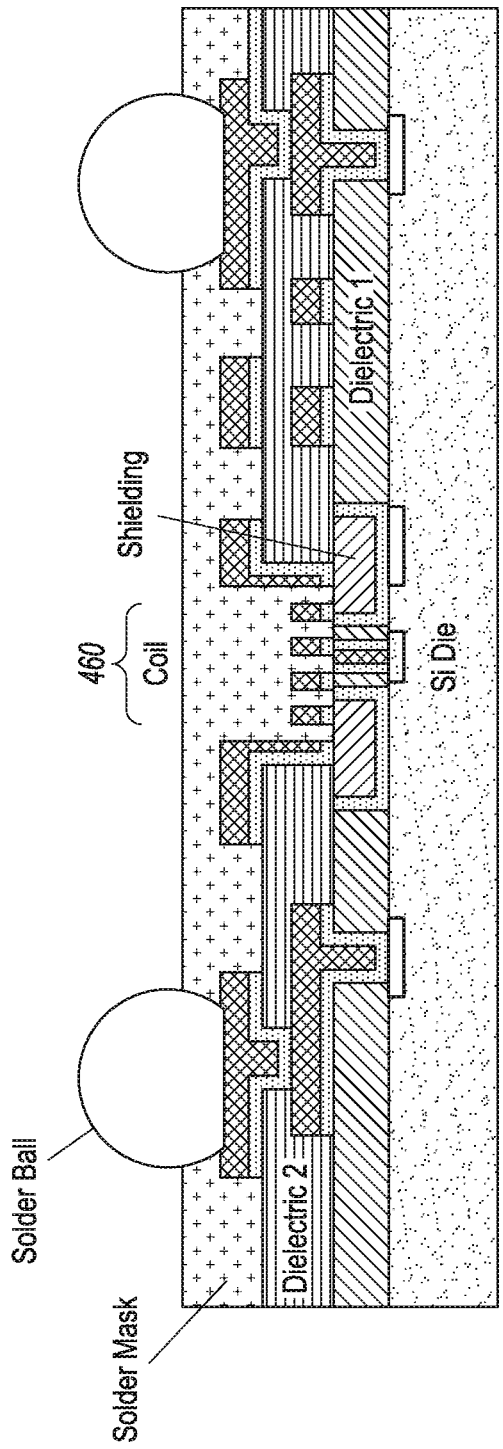

FIGS. 4A-5B illustrate cross-sections of a device with shielding in accordance with some embodiments. The various layers shown may be composed of the same materials as the layers in FIGS. 1A-1O, 2 and 3. The device 300 is formed on a single Si die 402. FIG. 4A shows the cross-section after deposition and structuring of the second dielectric layer 426. FIG. 4B shows the cross-section after application of the solder ball. As shown in FIG. 4A, the connection 452 to the coil is formed of the first copper layer 450 overlying the first seed layer 430 that contacts a pad 412 in the center of the big via 424. The plating resist 440 that forms each shielding portion 410 is disposed in separate smaller portions, rather than the entire big via as in the embodiment shown in FIGS. 1A-1O. As shown in FIG. 4B, the coils of the coil 460 is disposed on the plating resist 440 or the first dielectric layer 420 and again contained entirely within big via 424.

FIGS. 5A-5I illustrate cross-sections of a device with shielding in accordance with some embodiments. The various layers shown may be composed of the same materials as the layers in FIGS. 1A-1O and 2-4. One difference between the device 500 and device 100 is that the coil is formed on the second dielectric layer instead of in a big via.

Figure 5A:
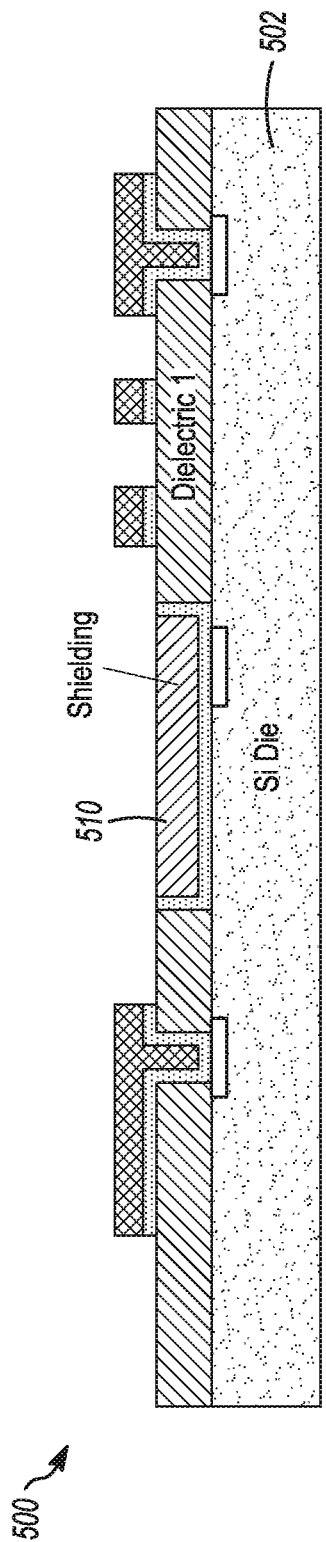
Figure 5B:
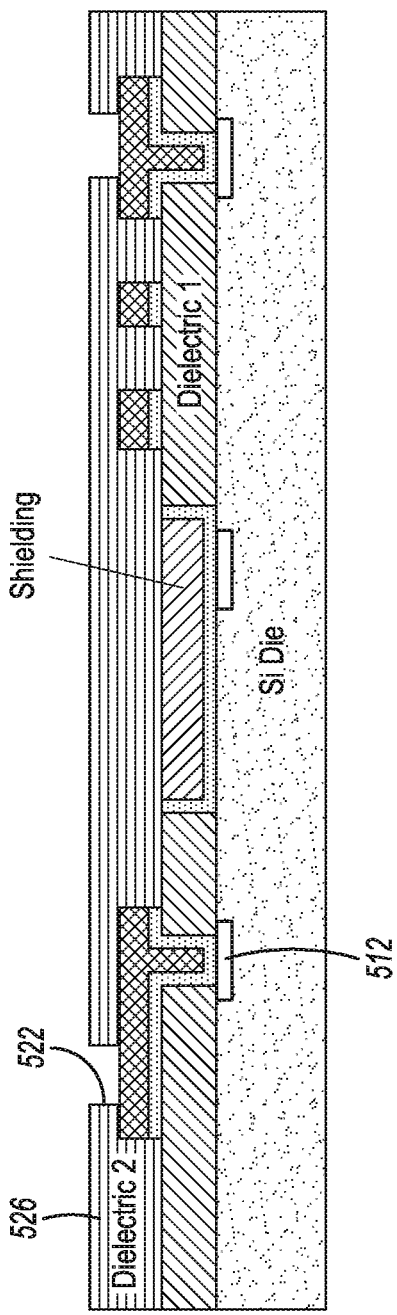

FIG. 5A illustrates a cross-section after removal of the exposed first seed layer. FIG. 5A may be essentially the same as FIG. 1G, having the same structure and formed of the same materials. The shielding 510 (the plating resist and first seed layer) is disposed within the big via on the Si die 502. FIG. 5B shows deposition of the second dielectric layer 526. While standard vias 522 to the contact pads that are not below the shielding 510 may be formed in the second dielectric layer 526, no via may be formed over the shielding 510. Consequently, the second seed layer 532, shown in FIG. 5C, is also entirely planar between the standard vias 522 in the second dielectric layer 526 and only a connection to the contact pads 512 is exposed.

Figure 5E:
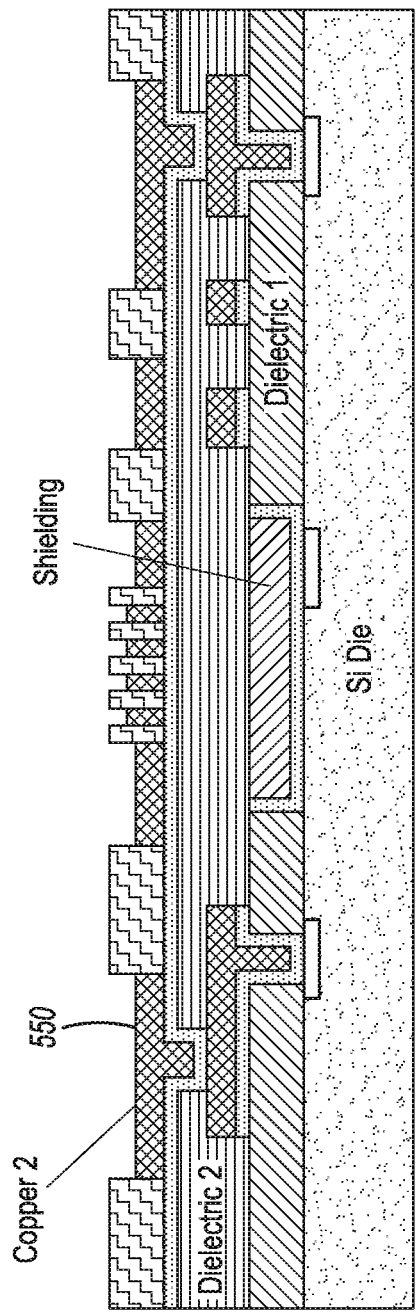
Figure 5F:
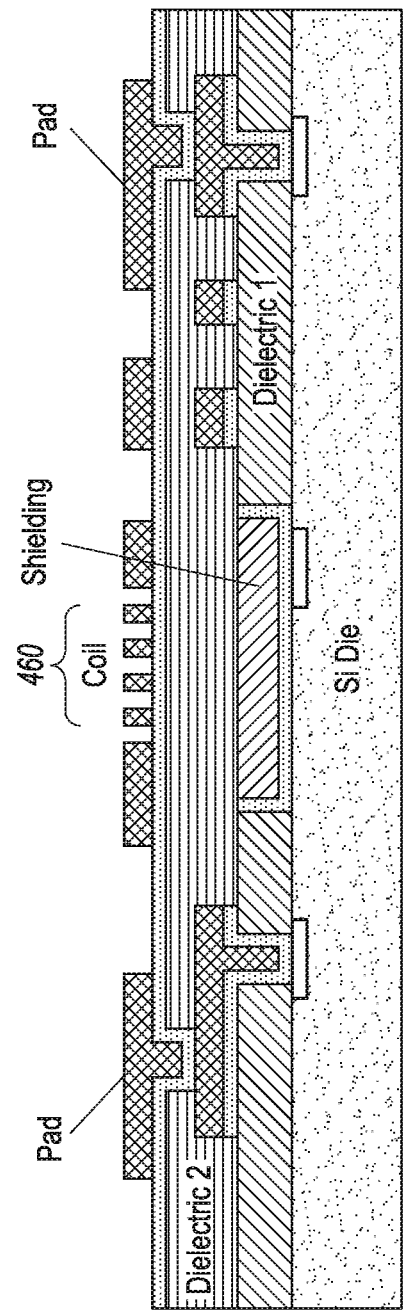

After deposition of the second seed layer 532, the plating resist 540 may be spun on and patterned in the same manner as described above. The plating resist 540 used to create the coil 560 may thus be disposed on the second dielectric layer 526 rather than in a via in the second dielectric layer 526, as in the embodiment shown in FIGS. 1A-1O. The consequence of this is shown in FIGS. 5E and 5F—in which the second copper layer 550 is plated and then the plating resist 540 removed, respectively. As shown, the coil 560 is disposed above the shielding 510, but also above rather than within the second dielectric layer 526.

Figure 5I:
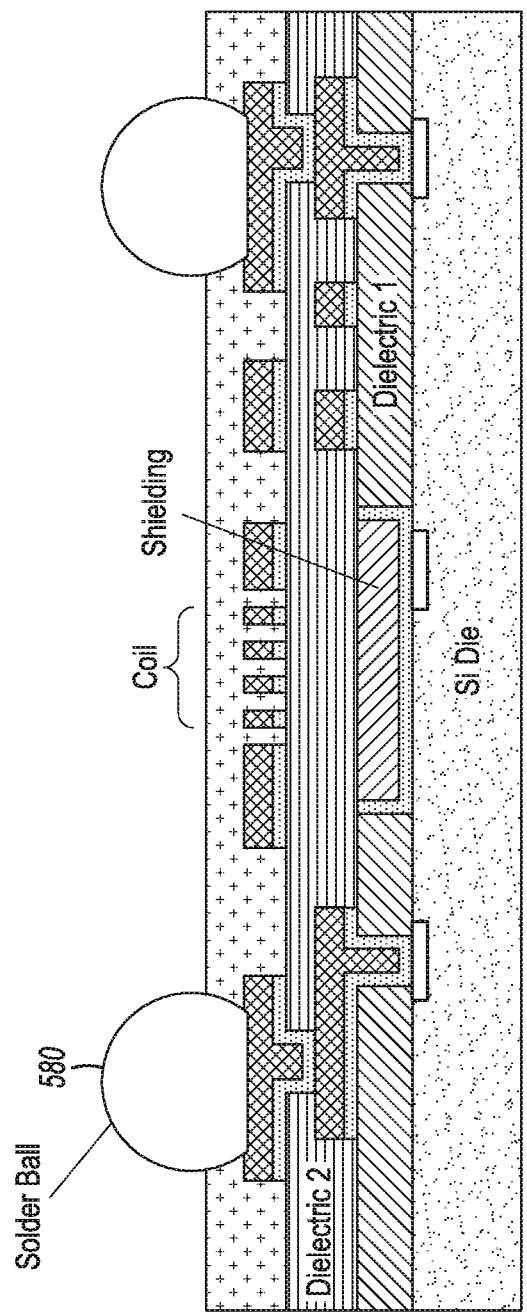

FIG. 5G illustrates a cross-section after removal of the second seed layer 532 through wet chemical etching. FIG. 5H shows deposition of the solder mask 570. The solder mask 570 may be patterned to expose the pads that connect with the underlying contact pads 512 on the Si die 502. FIG. 5I shows the device 500 after deposition of the solder ball 580. Accordingly, the coil 560 is still disposed within the device 500—in the solder mask 570 rather than the second dielectric layer as in FIGS. 1A-1O and FIGS. 2-4. In any of these embodiments however, the overall size of the device may be reduced.

Figure 6:
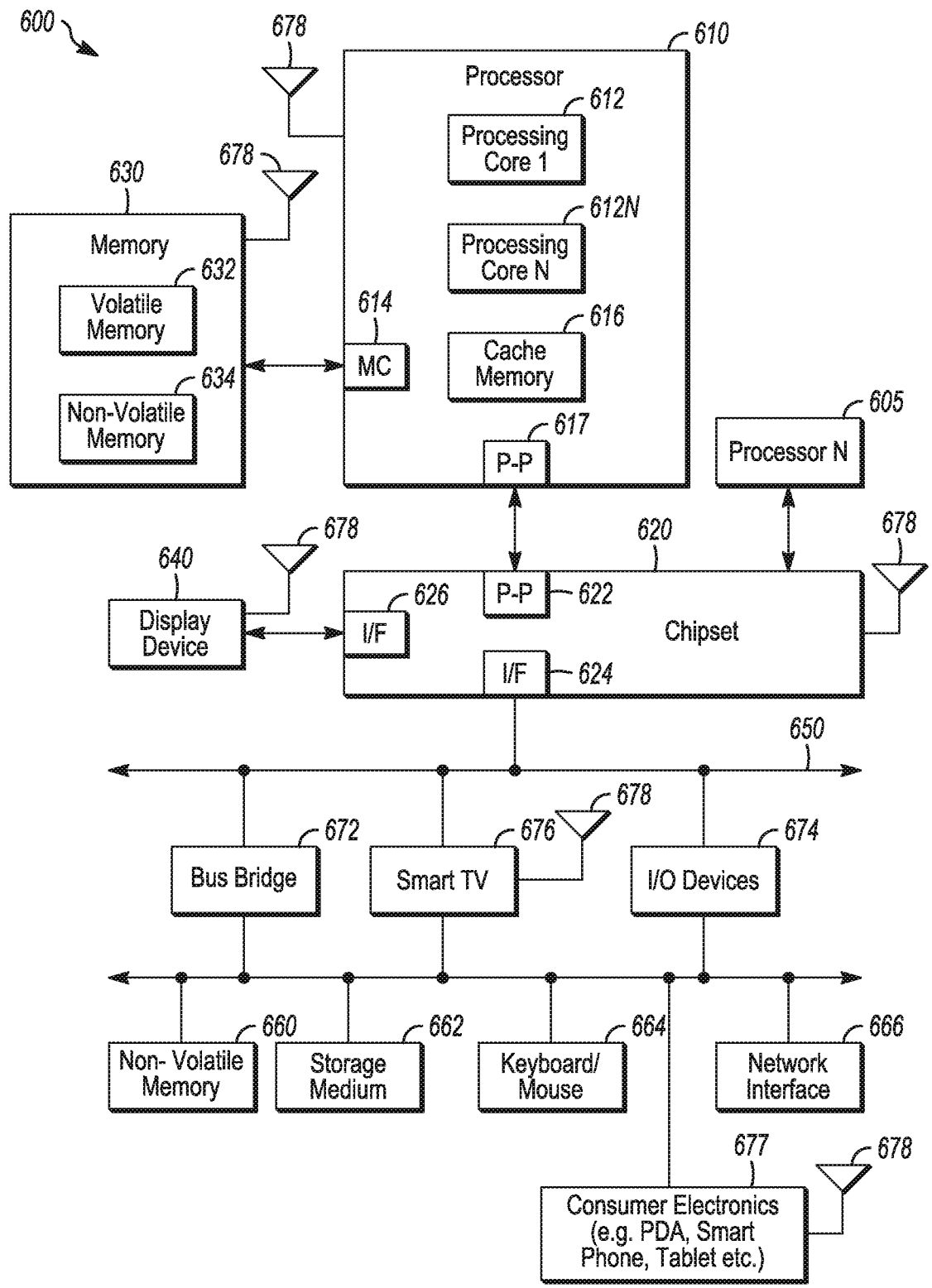
FIG. 6 shows a block diagram of an electronic device with shielding in accordance with some embodiments.

FIG. 6 shows a block diagram of an electronic device with shielding in accordance with some embodiments. FIG. 6 illustrates a system level diagram that includes an electronic device (e.g., system) having a structure and/or formed by the methods described herein. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with the 3GPP and/or IEEE 802.11 standard protocol, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the 3GPP standard and its related family, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

ADDITIONAL NOTES AND EXAMPLES

Example 1 is a device comprising: a base on which a conductive contact pad is disposed; a first dielectric disposed on the base, the first dielectric containing a smaller via and a larger via, the larger via filled with shielding, the smaller via comprising a first seed layer and a first conductor disposed on the first seed layer, the first seed layer contacting a first contact pad; a second dielectric disposed on the first dielectric, the second dielectric containing a dielectric via comprising a second seed layer and a second conductor disposed on the second seed layer, the second seed layer in contact with the first conductor; a solder resist layer disposed on the second dielectric, an opening in the solder resist layer containing a solder resist via through which electrical connection to the second conductor is made; and a coil connected with at least one of communication or power circuitry, the coil formed over the shielding and one of: in the larger via of the second dielectric, or on the second dielectric and covered by the solder resist layer.

In Example 2, the subject matter of Example 1 includes, wherein the shielding comprises a resist on the first seed layer.

In Example 3, the subject matter of Example 2 includes, wherein the coil comprises the second conductor and the underlying second seed layer.

In Example 4, the subject matter of Example 3 includes, wherein: the base comprises a single Si die, the coil is disposed in the larger via of the second dielectric, and the first seed layer of the shielding contacts a second contact pad in the Si die.

In Example 5, the subject matter of Example 4 includes, wherein: the shielding comprises a plurality of shielding portions separated by the first dielectric, and a third contact is disposed on the base, the coil in electrical contact with the third contact through a middle via in the first dielectric.

In Example 6, the subject matter of Examples 3-5 includes, wherein the base comprises a Si die and an insulating mold compound, the shielding disposed over the mold compound.

In Example 7, the subject matter of Example 6 includes, wherein: the coil is disposed in the larger via of the second dielectric, and a connection to the shielding is disposed on the second dielectric adjacent to the coil, the connection comprises the first conductor and the underlying first seed layer.

In Example 8, the subject matter of Example 7 includes, wherein: the base comprises multiple Si die on opposing sides of the mold compound, and on each Si die: a different contact pad is disposed, the first dielectric is disposed on the different contact pad and contains a different smaller via filled with the first seed layer and the first conductor and contacting the different contact pad, the second dielectric disposed on the first dielectric, the second dielectric contains a different dielectric via filled with the second seed layer and the second conductor and in contact with the first conductor, and the solder resist layer disposed on the second dielectric, an opening in the solder resist layer containing a different solder resist via through which electrical connection to the second conductor is made.

In Example 9, the subject matter of Examples 3-8 includes, wherein: the base comprises a single Si die, the coil is disposed on the second dielectric and covered by the solder resist layer, and the first seed layer of the shielding contacts a second contact pad on the Si die.

Example 10 is a method for providing coil shielding for an electronic device, the method comprising: forming contact pad on a base; depositing and patterning a first dielectric on the base, the first dielectric patterned with a smaller via and a larger via; depositing a first seed layer on the smaller via and larger via, the first seed layer contacting a first contact pad under the smaller via; depositing and patterning a first plating resist layer after depositing the first seed layer, the first plating resist layer patterned to have openings above the smaller via and to fill the larger via to create shielding; plating a first copper layer in the openings of the first plating resist layer; removing the first plating resist layer after plating the first copper layer and removing portions of the first seed layer exposed after removal of the first plating resist layer; depositing and patterning a second dielectric after removal of the first seed layer, the second dielectric patterned to provide a dielectric via over the first copper layer; depositing a second seed layer on the dielectric via, the second seed layer contacting the first copper layer; depositing and patterning a second plating resist after depositing the second seed layer, the second plating resist patterned to have openings above the second seed layer in electrical communication with the first copper layer and to have a coil pattern above the shielding; plating a second copper layer after patterning the second plating resist to create contacts to the first contact pad and to create a coil above the shielding; removing the second plating resist layer after plating the second copper layer and removing portions of the second seed layer exposed after removal of the second plating resist layer; and depositing and patterning a solder resist layer after removal of the second seed layer, the solder resist layer covering the coil and having openings to contact the second copper layer in electrical communication with the first contact pad.

In Example 11, the subject matter of Example 10 includes, wherein: the base comprises a single Si die, the second dielectric is patterned with a large via over the shielding, the coil is formed in the larger via of the second dielectric, and the first seed layer of the shielding contacts a second contact pad in the Si die.

In Example 12, the subject matter of Example 11 includes, wherein: the shielding comprises a plurality of shielding portions separated by the first dielectric, and a third contact is disposed on the base, the coil in electrical contact with the third contact through a middle via in the first dielectric.

In Example 13, the subject matter of Examples 10-12 includes, wherein the base comprises a Si die and a mold compound, and the shielding is formed over the mold compound.

In Example 14, the subject matter of Example 13 includes, wherein: the second dielectric is patterned with a large via over the shielding, the coil is formed in the larger via of the second dielectric, and a connection to the shielding is disposed on the second dielectric adjacent to the coil, and the connection comprises the first conductor and the underlying first seed layer.

In Example 15, the subject matter of Example 14 includes, wherein: the base comprises multiple Si die on opposite sides of the mold compound, and on each Si die: a different contact pad is fabricated, the first dielectric is deposited on the different contact pad and patterned to contain a different smaller via filled with the first seed layer and the first conductor and contacting the different contact pad, the second dielectric disposed on the first dielectric, the second dielectric contains a different dielectric via filled with the second seed layer and the second conductor and in contact with the first conductor, and the solder resist layer is deposited on the second dielectric, an opening in the solder resist layer containing a different solder resist via through which electrical connection to the second conductor is made.

In Example 16, the subject matter of Examples 10-15 includes, wherein: the base comprises a single Si die, the coil is formed on the second dielectric and covered by the solder resist layer, and the first seed layer of the shielding contacts a second contact pad on the Si die.

Example 17 is a method for providing coil shielding for an electronic device, the method comprising: depositing and patterning multiple dielectric layers on at least one of a semiconductor substrate or insulating mold compound, the dielectric layers patterned to provide conductive contact with a contact pad on the at least one of the semiconductor substrate or mold compound, shielding in a via of a lowermost of the dielectric layers comprising multiple layers that comprise an insulating material on a conductive seed layer; fabricating a conductive coil over the shielding; and depositing and patterning an insulating solder mask that covers and insulates the conductive coil, the conductive coil fabricated one of in a via of a dielectric layer immediately below the solder mask or above the dielectric layer immediately below the solder mask.

In Example 18, the subject matter of Example 17 includes, wherein: the shielding is formed on the semiconductor substrate, the dielectric layers are formed with vias of different widths, the seed layer of the shielding is formed in electrical contact with a contact pad on the semiconductor substrate, and the coil is formed in the via of the dielectric layer immediately below the solder mask.

In Example 19, the subject matter of Examples 17-18 includes, wherein: the shielding is formed on the molding compound, the dielectric layers are formed with vias of different widths, the seed layer of the shielding is formed in electrical contact with a conductive trace formed between the dielectric layers, and the coil is formed in the via of the dielectric layer immediately below the solder mask.

In Example 20, the subject matter of Examples 17-19 includes, wherein: the coil is formed above the dielectric layer immediately below the solder mask.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A method for providing coil shielding for an electronic device, the method comprising:
   forming contact pad on a base;
   depositing and patterning a first dielectric on the base, the first dielectric patterned with a smaller via and a larger via;
   depositing a first seed layer on the smaller via and larger via, the first seed layer contacting a first contact pad under the smaller via;
   depositing and patterning a first plating resist layer after depositing the first seed layer, the first plating resist layer patterned to have openings above the smaller via and to fill the larger via to create shielding;
   plating a first copper layer in the openings of the first plating resist layer;
   removing the first plating resist layer after plating the first copper layer and removing portions of the first seed layer exposed after removal of the first plating resist layer;
   depositing and patterning a second dielectric after removal of the first seed layer, the second dielectric patterned to provide a dielectric via over the first copper layer;
   depositing a second seed layer on the dielectric via, the second seed layer contacting the first copper layer;
   depositing and patterning a second plating resist layer after depositing the second seed layer, the second plating resist patterned to have openings above the second seed layer in electrical communication with the first copper layer and to have a coil pattern above the shielding;

plating a second copper layer after patterning the second plating resist to create contacts to the first contact pad and to create a coil above the shielding;

removing the second plating resist layer after plating the second copper layer and removing portions of the second seed layer exposed after removal of the second plating resist layer; and depositing and patterning a solder resist layer after removal of the second seed layer, the solder resist layer covering the coil and having openings to contact the second copper layer in electrical communication with the first contact pad.

2. The method of claim 1, wherein:
the base comprises a single Si die,
the second dielectric is patterned with a large via over the shielding,
the coil is formed in the larger via of the second dielectric, and
the first seed layer of the shielding contacts a second contact pad in the Si die.

3. The method of claim 2, wherein:
the shielding comprises a plurality of shielding portions separated by the first dielectric, and
a third contact is disposed on the base, the coil in electrical contact with the third contact through a middle via in the first dielectric.

4. The method of claim 1, wherein the base comprises a Si die and a mold compound, and the shielding is formed over the mold compound.

5. The method of claim 4, wherein:
the second dielectric is patterned with a large via over the shielding,
the coil is formed in the larger via of the second dielectric, and
a connection to the shielding is disposed on the second dielectric adjacent to the coil, and the connection comprises the first conductor and the underlying first seed layer.

6. The method of claim 5, wherein:
the base comprises multiple Si die on opposite sides of the mold compound, and on each Si die:
a different contact pad is fabricated,
the first dielectric is deposited on the different contact pad and patterned to contain a different smaller via filled with the first seed layer and the first conductor and contacting the different contact pad,
the second dielectric disposed on the first dielectric, the second dielectric contains a different dielectric via filled with the second seed layer and the second conductor and in contact with the first conductor, and
the solder resist layer is deposited on the second dielectric, an opening in the solder resist layer containing a different solder resist via through which electrical connection to the second conductor is made.

7. The method of claim 1, wherein:
the base comprises a single Si die,
the coil is formed on the second dielectric and covered by the solder resist layer, and
the first seed layer of the shielding contacts a second contact pad on the Si die.

8. A method for providing coil shielding for an electronic device, the method comprising:
depositing and patterning multiple dielectric layers on at least one of a semiconductor substrate or insulating mold compound, the dielectric layers patterned to provide conductive contact with a contact pad on the at least one of the semiconductor substrate or mold compound, shielding disposed in a via of a lowermost of the dielectric layers, the shielding comprising multiple shielding portions, each shielding portion comprising an insulating material on a conductive seed layer;

fabricating a conductive coil over the shielding portions; and depositing and patterning an insulating solder mask that covers and insulates the conductive coil, the conductive coil fabricated one of in a via of a dielectric layer immediately below the solder mask or above a dielectric layer immediately below the solder mask, an electrical connection to the coil disposed in another via in the lowermost of the dielectric layers between the shielding portions.

9. The method of claim 8, wherein:
the shielding is formed on the semiconductor substrate,
the dielectric layers are formed with vias of different widths,
the seed layer of the shielding is formed in electrical contact with a contact pad on the semiconductor substrate, and
the coil is formed in the via of the dielectric layer immediately below the solder mask.

10. The method of claim 8, wherein:
the via in which the coil is disposed being a single via that is larger than the via in which each shielding portion is disposed.

11. The method of claim 8, wherein:
the coil is formed above the dielectric layer immediately below the solder mask.

12. A method of fabricating a multilayer structure, the method comprising:
forming a base on a conductive contact pad;
depositing a first dielectric on the base;
forming a smaller via and a larger via in the first dielectric;
filling the larger via with shielding;
depositing a first seed layer and a first conductor disposed on the first seed layer in the smaller via, the first seed layer contacting a first contact pad;
depositing a second dielectric on the first dielectric;
forming a larger dielectric via and a smaller dielectric via in the second dielectric;
depositing a second seed layer and a second conductor on the second seed layer in both the larger dielectric via and smaller dielectric via in the second dielectric, the second seed layer in contact with the first conductor;
depositing a solder resist layer on the second dielectric;
forming an opening in the solder resist layer;
depositing a solder resist via in the opening in the solder resist layer through which electrical connection to the second conductor is made; and
forming a coil over the shielding and in the larger dielectric via in the second dielectric.

13. The method of claim 12, wherein the shielding comprises a resist on the first seed layer.

14. The method of claim 13, wherein the coil comprises the second conductor and the underlying second seed layer.

15. The method of claim 14, wherein:
the base comprises a single Si die,
the coil is disposed in the larger dielectric via, and
the first seed layer of the shielding contacts a second contact pad in the Si die.

16. The method of claim 15, wherein:
the shielding comprises a plurality of shielding portions separated by the first dielectric, and
the method further comprises forming a third contact on the base, the coil in electrical contact with the third contact through a middle via in the first dielectric.

17. The method of claim 14, wherein the base comprises a Si die and an insulating mold compound, the shielding disposed over the mold compound.

18. The method of claim 17, further comprising:
forming a connection to the shielding on the second dielectric adjacent to the coil, the connection comprising the first conductor and the underlying first seed layer.

19. The method of claim 18, wherein:
the base comprises multiple Si die on opposing sides of the mold compound, and on each Si die:
a different contact pad is disposed,
the first dielectric is disposed on the different contact pad and contains a different smaller via filled with the first seed layer and the first conductor and contacting the different contact pad,
the second dielectric disposed on the first dielectric,
the second dielectric contains a different dielectric via filled with the second seed layer and the second conductor and in contact with the first conductor, and
the solder resist layer disposed on the second dielectric, an opening in the solder resist layer containing a different solder resist via through which electrical connection to the second conductor is made.

20. The method of claim 12, wherein the first and second dielectric contact each other.

21. The method of claim 12, wherein the second dielectric contacts the shielding.

22. The method of claim 21, wherein the second dielectric contacts the first seed layer disposed between the first dielectric and the shielding.

* * * * *